United States Patent [19]

Fujiyama et al.

[11] Patent Number: 5,415,691
[45] Date of Patent: May 16, 1995

[54] SOLUTION COATING APPARATUS

[75] Inventors: Shigemi Fujiyama; Kazunobu Yamaguchi; Hiroyoshi Sago, all of Kanagawa, Japan

[73] Assignee: Tokyo Ohka Kogyo Co., Ltd., Kanagawa, Japan

[21] Appl. No.: 994,364

[22] Filed: Dec. 21, 1992

[30] Foreign Application Priority Data

Dec. 20, 1991 [JP] Japan ................................ 3-355935

[51] Int. Cl.⁶ .................. B05C 5/00; B05C 13/02; B05C 11/02
[52] U.S. Cl. ................................ 118/52; 118/501; 269/21; 279/3; 451/388
[58] Field of Search ................ 118/52, 500, 501; 269/21, 20; 279/3; 51/235, 131.5

[56] References Cited

U.S. PATENT DOCUMENTS

| | | | |
|---|---|---|---|
| 3,730,134 | 5/1973 | Kadi | 51/235 X |
| 4,640,846 | 2/1987 | Kuo | 118/52 X |
| 4,889,069 | 12/1989 | Kawakami | 118/52 X |
| 5,042,421 | 8/1991 | Anbe | 118/52 |
| 5,234,499 | 8/1993 | Sasaki et al. | 118/52 |

FOREIGN PATENT DOCUMENTS 2531134 1/1976 Germany .
2-219213 8/1990 Japan .

*Primary Examiner*—Michael W. Ball
*Assistant Examiner*—Francis J. Lorin
*Attorney, Agent, or Firm*—Weiner, Carrier & Burt; Joseph P. Carrier; Irving M. Weiner

[57] ABSTRACT

A glass substrate is supported on a pedestal in a rotatable cup having an upper opening. The pedestal, which is substantially similar in shape to the glass substrate, has a ridge extending along an outer peripheral edge of an upper surface thereof, for engaging an outer peripheral edge of a lower surface of the glass substrate. After a resist solution to be coated on the glass substrate is applied to an upper surface thereof, the upper opening of the rotatable cup is closed by a cover, and then the rotatable cup is rotated to spread the applied resist solution uniformly over the upper surface under centrifugal forces. In one embodiment, the apparatus comprises an inner rotatable cup and an outer rotatable cup, each with its own separate cover. In another embodiment, a pedestal is mounted on the bottom of the inner cup having a vacuum chuck movable therein. In a third embodiment, a flow-rectifying plate is mounted on the lower surface of the cover whereby fluid from nozzles is ejected onto the upper surface of the flow rectifying plate and then into the cup.

18 Claims, 5 Drawing Sheets

SOLUTION COATING APPARATUS

BACKGROUND OF THE INVENTION

1. Field of the Invention

The present invention relates to an apparatus for coating a plate-like workpiece with a solution, and more particularly to a solution coating apparatus for use in the manufacture of liquid crystal displays (LCD) or the like.

2. Description of the Relevant Art

One modern display device that the image display industry has been making efforts to develop as a promising substitute for the conventional cathode-ray tube is a liquid crystal display which comprises a liquid crystal sandwiched between two glass substrates each composed of devices and electrodes that make up a plurality of pixels on its surface. According to the prevailing liquid crystal display design, the pixels are arranged in an active matrix drive system in which they are driven by devices such as thin-film transistors (TFT) or metal-insulator-metal (MIM) devices.

Thin-film transistors or other drive devices are fabricated on glass substrates by the semiconductor fabrication technology also used for fabricating integrated circuits on silicon wafers. The semiconductor fabrication process comprises a number of steps which includes the step of coating a resist solution on a glass substrate. In the coating step, a resist solution is dropped on a glass substrate that is set by a vacuum chuck in an inner cup, and then the vacuum chuck and the inner cup are rotated in unison with each other by a spinner for centrifugally forming a uniform coating of resist solution on the surface of the glass substrate.

When a glass substrate is to be set on or an uncoated glass substrate is to be removed from the vacuum chuck, the peripheral edge of a lower surface of the glass substrate is supported by a manipulator or the like so that the upper surface of the glass substrate remains untouched. To allow the manipulator or the like to support the peripheral edge of the lower surface of the glass substrate, it is necessary that a clearance be defined between the glass substrate and the bottom of the inner cup for the manipulator or the like to enter while the glass substrate is being placed on the vacuum chuck.

To meet such a requirement, it has been customary for the vacuum chuck to be smaller in diameter than the glass substrate, so that the glass substrate has its peripheral edge projecting radially outwardly of the vacuum chuck.

While the resist solution is being applied to the glass substrate, the glass substrate and the inner cup are rotated in unison with each other. However, the clearance which is present between the glass substrate and the bottom of the inner cup produces turbulent air flows, making the coating thickness irregular or forcing the resist solution around the peripheral edge to the lower surface of the glass substrate.

SUMMARY OF THE INVENTION

It is an object of the present invention to provide a solution coating apparatus which is capable of forming a coating of uniform thickness on a surface of a flat workpiece such as a glass substrate.

According to the present invention, there is provided an apparatus for coating a plate-like workpiece with a solution, comprising a rotatable cup for supporting a plate-like workpiece therein, the rotatable cup having an upper opening and a pedestal on a bottom thereof, the pedestal being substantially similar in shape to the plate-like workpiece, the pedestal having a ridge extending along an outer peripheral edge of an upper surface thereof, for engaging an outer peripheral edge of a lower surface of the plate-like workpiece, a cover for covering the upper opening of the rotatable cup, and means for rotating the rotatable cup with the plate-like workpiece supported therein while the upper opening is covered by the cover, to spread a dropped solution uniformly over a surface of the plate-like workpiece under centrifugal forces.

According to the present invention, there is also provided an apparatus for coating a plate-like workpiece with a solution, comprising a rotatable cup for supporting a plate-like workpiece therein, the rotatable cup having an upper opening, a pedestal on a bottom thereof, and a wall Joined to the bottom, the pedestal being substantially similar in shape to the plate-like workpiece, the wall being spaced a constant distance from an outer peripheral edge of the plate-like workpiece placed on the pedestal, a cover for covering the upper opening of the rotatable cup, and means for rotating the rotatable cup with the plate-like workpiece supported therein while the upper opening is covered by the cover, to spread a dropped solution uniformly over a surface of the plate-like workpiece under centrifugal forces.

According to the present invention, there is further provided an apparatus for coating a flat workpiece with a solution, comprising a pedestal for supporting a flat workpiece thereon with an upper surface thereof facing upwardly, the pedestal being substantially similar in shape to the flat workpiece, the pedestal having a ridge extending along an outer peripheral edge thereof for engaging an outer peripheral edge of a lower surface of the flat workpiece, cover means for covering the pedestal with the flat workpiece supported thereon, means for rotating the pedestal while the pedestal is covered by the cover means, and means on the cover means for applying a solution to the upper surface of the flat workpiece supported on the pedestal, whereby the solution applied to the upper surface can be spread thereover under centrifugal forces produced when the pedestal is rotated by the rotating means.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
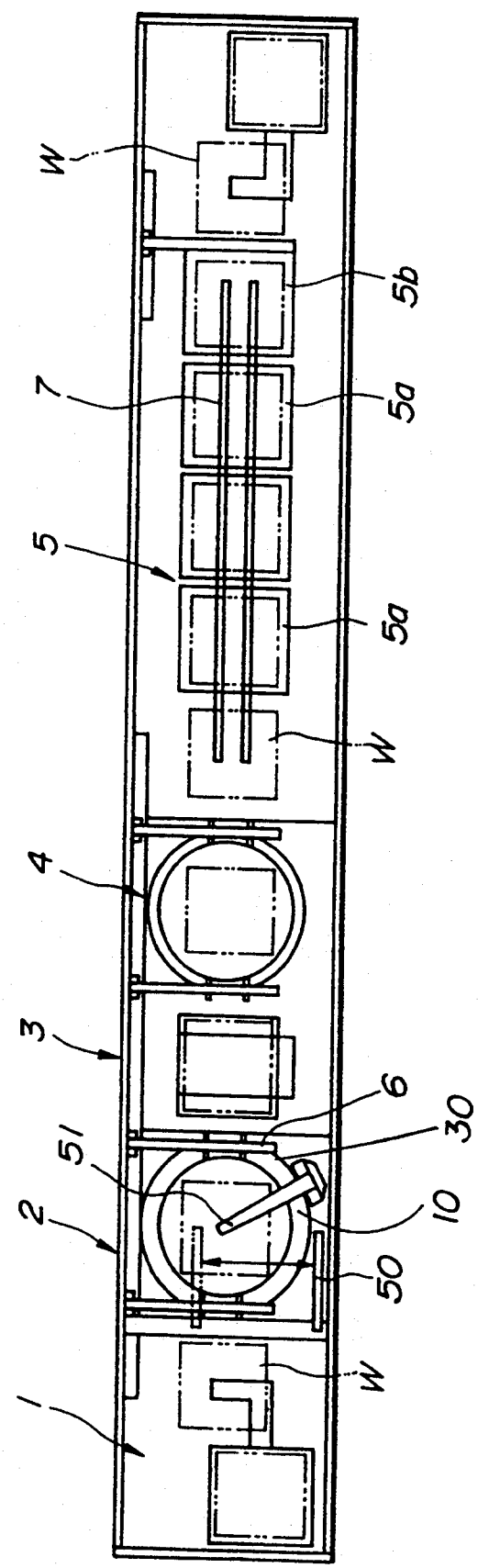
FIG. 1 is a plan view of a solution coating line including a solution coating apparatus according to the present invention.

FIG. 1 shows a solution coating line including a solution coating apparatus according to the present invention. The solution coating apparatus is illustrated as being employed to coat a resist solution on a glass substrate for use in a liquid crystal display.

The solution coating line has an upstream end shown as the lefthand end in FIG. 1 and a downstream end as the righthand end. The solution coating line includes a supply unit 1 disposed on the upstream end thereof for supplying a rectangular plate-like workpiece, i.e., a glass substrate W. The solution coating apparatus, generally denoted by 2, is positioned immediately downstream of the supply unit 1. The solution coating line also includes a vacuum drier 3, a cleaning device 4 for cleaning the reverse side (lower surface) of a glass substrate W, and a heater 5 including hot plates 5a and a cooling plate 5b. The vacuum drier 3, the cleaning device 4, and the heater 5 are successively arranged downstream of the solution coating apparatus 2.

A glass substrate W is fed from the supply unit 1 to the heater 5 by a feeder 6 which supports the lower surface of the glass substrate W at its front and rear ends. In the heater 5, the glass substrate W is moved successively over the hot plates 5a by a feeder 7 which supports the lower surface of the glass substrate W and moves angularly from end to end in a vertical plane. Finally, the glass substrate W is fed by the feeder 7 over the cooling plate 5b which regulates the temperature of the glass substrate W.

Figure 2:
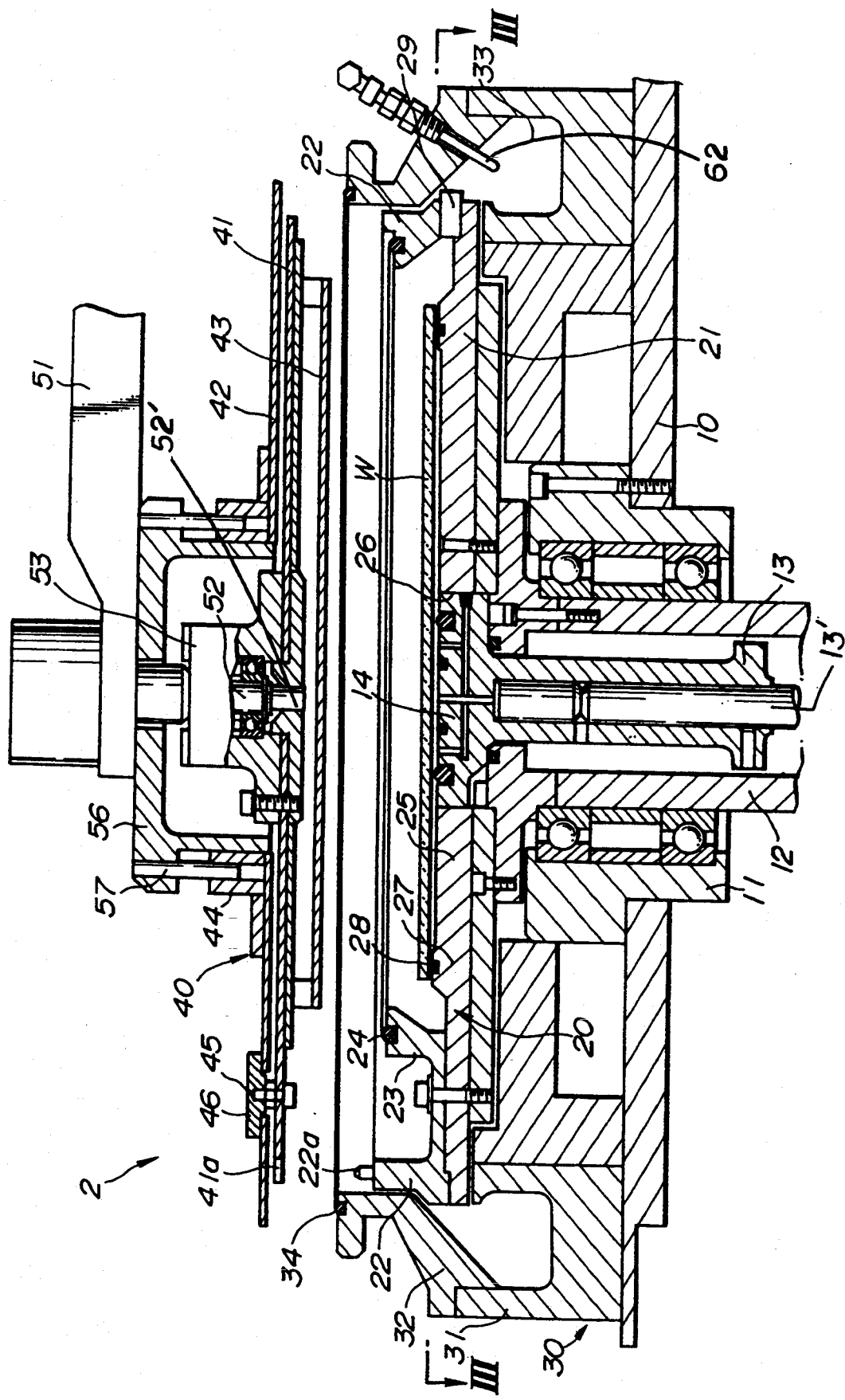
FIG. 2 is a vertical cross-sectional view taken along bent line II—II of FIG. 3, showing the solution coating apparatus with a cover assembly lifted.
Figure 3:
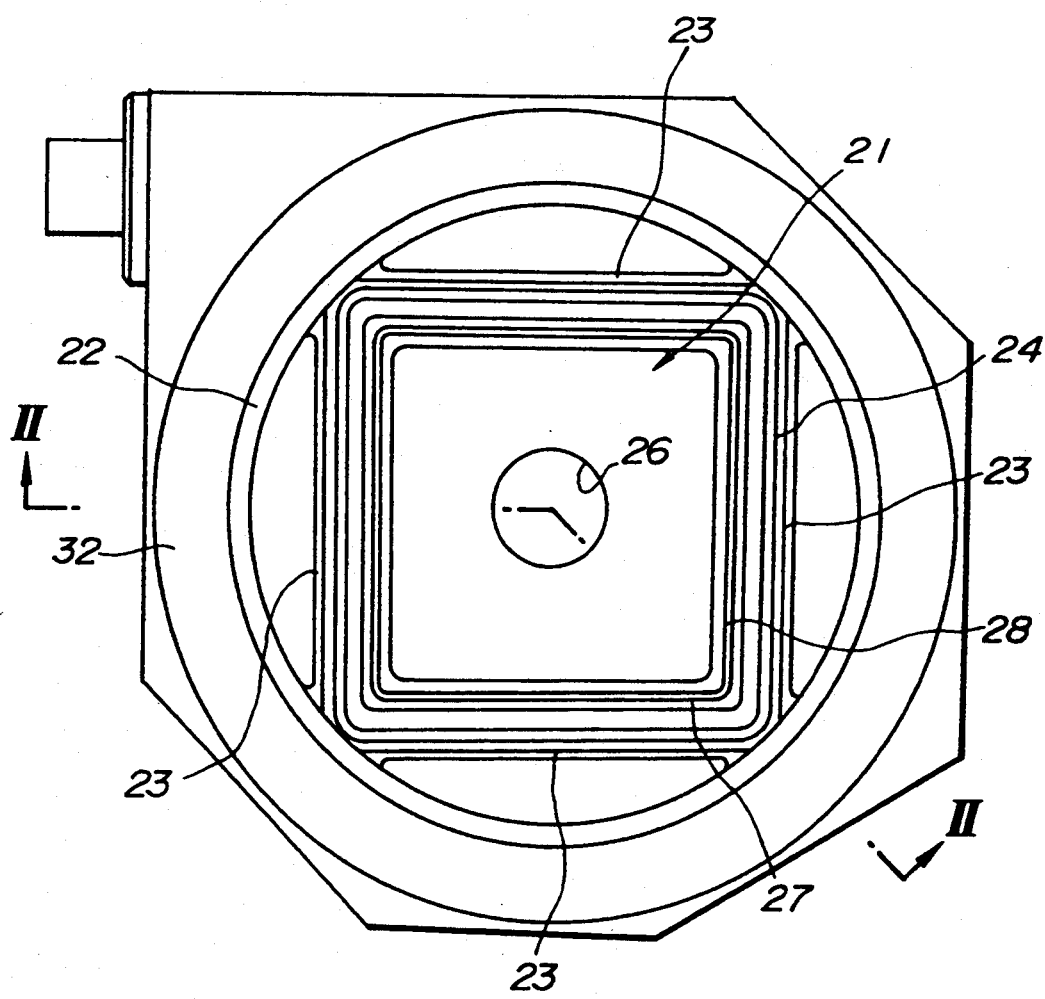
FIG. 3 is a horizontal cross-sectional view taken along line III—III of FIG. 2 looking downwardly below a nozzle-supporting arm and a cover assembly of the solution coating apparatus.

As shown in FIG. 2, the solution coating apparatus 2 generally comprises a horizontal base 10, an upwardly opening inner cup 20, an upwardly opening outer cup 30, and a cover assembly 40.

The base 10 has a bearing 11 mounted in an opening defined therein. A spinner (not shown) has a hollow shaft 12 extending vertically through and rotatably supported by the bearing 11. The inner cup 20 has a horizontal bottom plate 21 fixedly mounted on the upper end of the hollow shaft 12, and an annular wall 22 vertically mounted on the circumferential edge of the upper surface of the bottom plate 21. The bottom plate 21 and the annular wall 2 of the inner cup 20 jointly assume a cup shape.

The glass substrate W is placed on the bottom plate 21 of the inner cup 20. Since the glass substrate W is of rectangular shape, its outer peripheral edges are not equally spaced from the inner circumferential surface of the annular wall 22. Therefore, when the glass substrate W is rotated by the spinner, turbulent air flows would easily be produced by the glass substrate W. To prevent such turbulent air flows from being produced, a rectangular wall 23 is disposed on the bottom plate 21 radially inwardly of the annular wall 22 so that the rectangular wall 23 extends complementarily around the glass substrate W positioned on the bottom plate 21. Specifically, all sides of the rectangular wall 23 are equally spaced radially outwardly from the corresponding sides of the outer peripheral edge of the glass substrate W placed on the bottom plate 21. The corners of the rectangular wall 23 are Joined to the inner circumferential edge of the annular wall 22. An elongate seal member 24 is mounted on and extends along the upper surface of the rectangular wall 23.

The bottom plate 21 has a raised pedestal 25 substantially similar in shape to the glass substrate W. The pedestal 25 has a central opening 26 defined therein and a ridge 27 disposed on an upper surface thereof and extending along an outer periphery thereof, for engaging the outer peripheral edge of the glass substrate W at its lower surface. An elongate seal member 28 is mounted on and extends along the upper surface of the ridge 27.

A vertically movable vacuum chuck 13 extends vertically through the hollow shaft 12, and has an upper suction port section 14 which is positioned in the central opening 26, the upper suction port section 14 having upper port ends opening upwardly at the upper end surface of the vacuum chuck 13. The chuck 13 is supported on a vertically movable shaft 13', for effecting vertical movements thereof. When the vacuum chuck 13 is moved upwardly into an upper position in which its upper surface lies above the pedestal 25, it receives and transfers the glass substrate W. When the vacuum chuck 13 is moved downwardly into a lower position as shown in FIG. 2, its upper end surface lies substantially flush with or is slightly lower than the upper surface of the ridge 27.

The outer cup 30 comprises an annular block 31 fixedly mounted on the base 10 and an annular wall 32 attached to and extending upwardly from the annular block 31. The annular block 31 has an annular drain passage 33 defined therein and opening upwardly, with the annular wall 32 overhanging the annular drain passage 33. A drain pipe 29, which is mounted in the inner cup 20, has an inner end opening into the inner cup 20 and an outer end opening into the annular drain passage 33. The annular wall 32 has an inner circumferential surface which is spaced radially outwardly of the outer circumferential surface of the annular wall 22 of the inner wall 20 by a small clearance. An elongate seal member 34 is mounted on and extends along the upper surface of the annular wall 32. A nozzle 62 is mounted to the annular wall 32 for ejecting a cleaning solution into the passage 33.

As shown in FIG. 1, the solution coating apparatus 2 further includes two arms 50, 51 extending over the inner cup 20 and the outer cup 30. The arms 50, 51 are horizontally movable linearly and angularly, respectively, and vertically movable out of interference with each other. The arm 50 supports a nozzle for dropping a solution such as a resist solution onto the glass substrate W. The arm 51, which supports the cover assembly 40 as shown in FIG. 2, has a downwardly extending shaft 52 on its distal end. The shaft 52 has a nozzle 52' for ejecting a nitrogen gas or a cleaning solution.

A boss 53 is rotatably fitted over the shaft 52 through a bearing and a magnetic seal. The cover assembly 40 has a circular cover 41 of aluminum for closing the upper opening of the inner cup 20, the circular cover 41 being mounted on the boss 53. The cover assembly 40 also has another circular cover 42 for closing the upper opening of the outer cup 30, the circular cover 42 being supported by the distal end of the arm 51 and lying slightly above the cover 41.

A flow-rectifying plate 43 is attached to the lower surface of the cover 41 for preventing turbulent flows from being produced in the inner cup 20. The flow-rectifying plate 43 is similar in shape to the glass substrate W, but has dimensions slightly larger than the glass substrate W. The cover 42 has a central hole defined therein which is fitted over a tubular body 56 secured to the lower surface of the distal end of the arm 51. The cover 42 is vertically slidable on the tubular body 56 when the cover 42 is guided by Teflon bearings 44 mounted on the cover 42 and slidably fitted over respective vertical guide posts 57 that are fixed to the tubular body 56.

When the cover 41 is moved downwardly to close the inner cup 20, and the inner cup 20, the glass substrate W, and the flow-rectifying plate 43 are rotated, a resist solution previously dropped on the glass substrate W is spread radially outwardly on the glass substrate W under centrifugal forces. At this time, it is necessary that the flow-rectifying plate 43 be superimposed over the glass substrate W in full angular alignment with each other or in slight angular displacement from each other.

The above requirement can be met as follows: The cover 41 has a recess 41a defined in an outer circumferential edge thereof for fitting over a vertical pin 22a mounted on the upper surface of the annular wall 22. An upwardly extending pin 45 is mounted on the cover 41 in a position spaced radially inwardly from the recess 41a. The cover 42 supports thereon a receiver 46 in which the upper end of the pin 45 engages. Since the cover 42 is prevented from rotating by the guide posts 57 and hence is angularly positioned with respect to the glass substrate W, the cover 41 and the flow-rectifying plate 43 are also angularly positioned with respect to the glass substrate W when the cover 41 is elevated and the pin 45 engages in the receiver 46 as shown in FIG. 2. Thereafter, the arm 51 is lowered to place the outer circumferential edge of the cover 42 on the upper end of the outer cup 30. At this time, the recess 41a is positioned directly above the pin 22a. Upon further downward movement of the cover 41, the recess 41a is fitted over the pin 22a, as shown in FIG. 4, thus angularly positioning the flow-rectifying plate 43 with respect to the glass substrate W.

A process of coating the upper surface of the glass substrate W with a resist solution will be described below. With the inner cup 20 and the outer cup 30 being open upwardly, a glass substrate W is placed on the pedestal 25, and attracted thereto under a vacuum developed by the vacuum chuck 13 and acting through the upper suction port section 14. Then, a resist solution is dropped from the nozzle of the arm 50 onto the upper surface of the glass substrate W. Then, the arm 50 is horizontally retracted, and the arm 51 is angularly moved to a position over the inner and outer cups 20, 30 to position the covers 41, 42 thereabove, as shown in FIG. 2.

Figure 4:
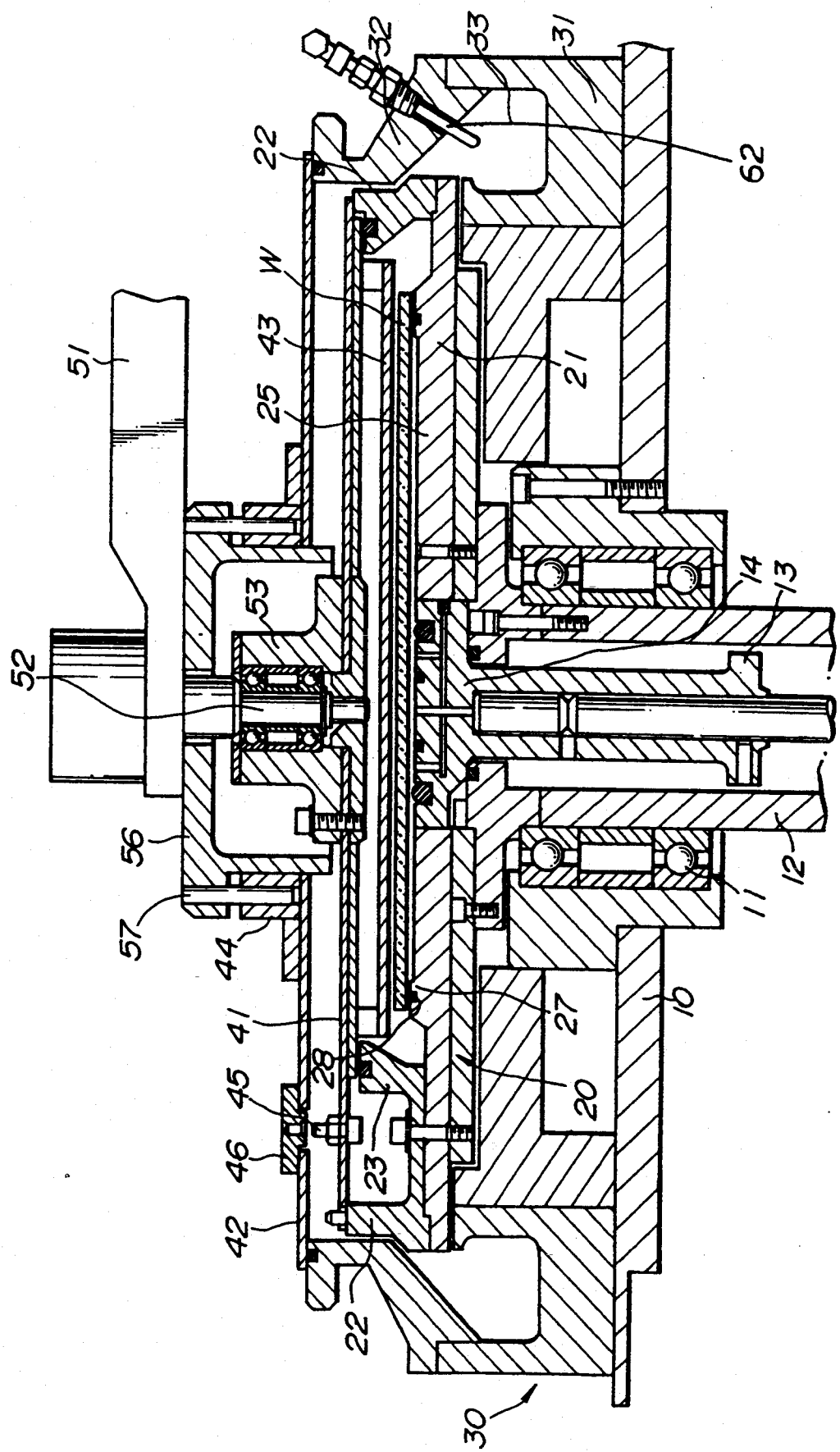
FIG. 4 is a vertical cross-sectional view of the solution coating apparatus similar to FIG. 2, but with the cover assembly lowered.

Thereafter, as illustrated in FIG. 4, the arm 51 is lowered to cause the cover 41 to close the inner cup 20 and also to cause the cover 42 to close the outer cup 30. The spinner is actuated to rotate the vacuum chuck 13 and the inner cup 20 in unison with each other for thereby spreading the resist solution radially outwardly to form a uniform coating of the resist solution on the upper surface of the glass substrate W under centrifugal forces.

During the above coating process, a partial vacuum is developed in the inner cup 20. If the covers 41, 42 were immediately lifted for removal of the glass substrate W, the remaining air in the inner cup 20 would be disturbed, causing the resist solution to be applied as spots to the upper surface of the glass substrate W. To remove the glass substrate W with a uniform coating of resist solution, a nitrogen gas or the like is first introduced from the nozzle of the shaft 52 into the space between the cover 41 and the flow-rectifying plate 43, developing a pressure buildup in the inner cup 20 thereby to eliminate the partial vacuum therein. At this time, the flow-rectifying plate 43 prevents the introduced gas from being directly applied to the coating of resist solution on the glass substrate W.

After a number of glass substrates W have successively been coated with the resist solution, an excess of coating solution is attached to the inner circumferential surface of the inner cup 20 and other surfaces. If the excess coating solution remained on those surfaces, it would dry and scatter into the atmosphere, and then deposit on the upper surface of the glass substrate W causing undesirable imperfections.

Figure 5:
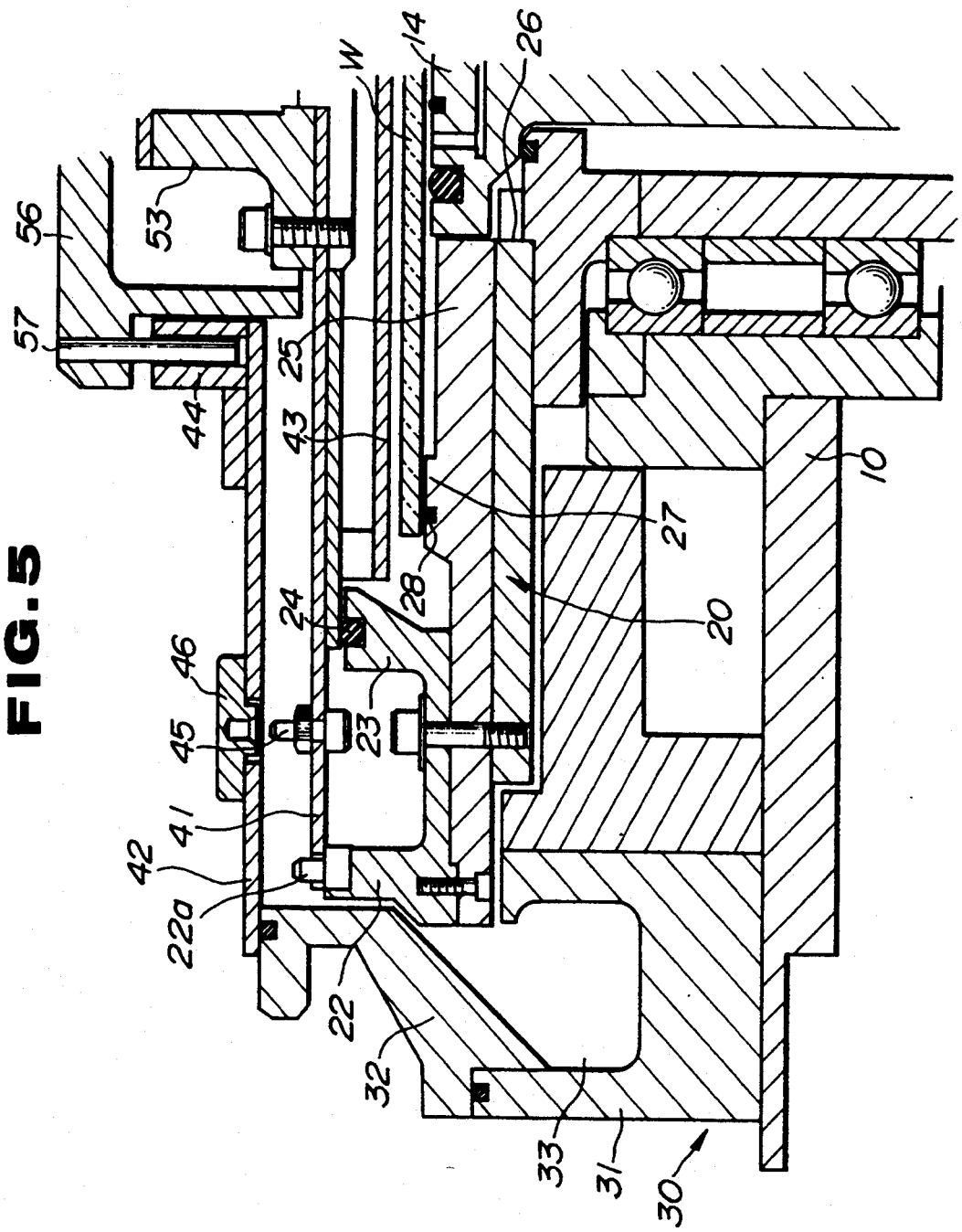
FIG. 5 is an enlarged fragmentary vertical cross-sectional view of the solution coating apparatus corresponding to a left side portion of FIG. 4.

Therefore, the inner and outer cups 20, 30 are cleaned according to the invention to remove any excessive deposit of coating solution. To clean the inner and outer cups 20, 30, the coated glass substrate W is removed, and the covers 41, 42 are lowered to close the inner and outer cups 20, 30. Then, a cleaning solution is supplied from a cleaning solution supply through the nozzle 52' of the shaft 52 into the space between the cover 41 and the flow-rectifying plate 43. As shown in FIG. 5, the supplied cleaning solution flows on the upper surface of the flow-rectifying plate 43 under centrifugal forces. Part of the cleaning solution reaches the inner circumferential surface of the inner cup 20, washing the deposited coating solution off the inner circumferential surface of the inner cup 20. The removed coating solution and the cleaning solution are then discharged through the drain pipe 29 into the drain passage 33.

The ridge 27 on the pedestal 25 which is similar in shape to the glass substrate W abuts against the outer peripheral edge of the lower surface of the glass substrate W. Therefore, no substantial clearance is defined between the glass substrate W and the bottom of the inner cup 20. No turbulent air flows are thus produced which would otherwise result in irregularities of the thickness of the coating of resist solution on the glass substrate W.

Since the ridge 27 contacts only the outer peripheral edge of the lower surface of the glass substrate W, the pedestal 25 is not held in full contact with the lower surface of the glass substrate W, which is therefore prevented from being scratched or otherwise damaged.

In the illustrated embodiment, the ridge 27 on the pedestal 25 supports the glass substrate W to keep the lower surface of the glass substrate W out of full contact with the upper surface of the pedestal 25. However, the ridge 27 may be dispensed with, and the seal member 28 may be modified in shape or diameter to support the glass substrate W off the pedestal 25.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. An apparatus for coating a plate-like workpiece with a solution, comprising:

a rotatable cup for supporting a plate-like workpiece therein, said rotatable cup having an upper opening for receiving the plate-like workpiece therethrough and a pedestal on a bottom thereof, said pedestal being fixed to said rotatable cup anti substantially similar in shape m the plate-like workpiece, said pedestal having a ridge extending along an outer peripheral edge of an upper surface thereof, for engaging an outer peripheral edge of a lower surface of the plate-like workpiece;

a seal member mounted on an upper surface of said ridge;

a cover for covering said upper opening of said rotatable cup;

means for rotating said rotatable cup with the plate-like workpiece supported therein while said upper opening is covered by said cover, to spread a dropped solution uniformly over a surface of the plate-like workpiece under centrifugal forces:

said pedestal having a central opening defined therein; and a vacuum chuck disposed in said central opening for attracting the plate-like workpiece to said pedestal under a vacuum, wherein the vacuum chuck is movable relative to the pedestal.

2. An apparatus according to claim 1, wherein said ridge of the pedestal is arranged to abut against the outer peripheral edge of the lower surface of the plate-like workpiece, and said ridge extending radially outwardly to at least said outer peripheral edge of the lower surface of said workpiece.

3. An apparatus according to claim 1, wherein said vacuum chuck is movable into an upper position in which an upper surface thereof lies above said pedestal, for receiving and transferring the plate-like workpiece.

4. An apparatus according to claim 1, wherein said vacuum chuck is movable into a lower position in which an upper surface thereof lies substantially flush with or slightly lower than said ridge.

5. An apparatus according to claim 1, further comprising an outer cup disposed around said rotatable cup with a radial clearance defined therebetween, said outer cup having an upper opening, and said rotatable cup being rotatable with respect to said outer cup.

6. An apparatus according to claim 1, wherein said cover has a nozzle means for ejecting a fluid into said rotatable cup.

7. An apparatus according to claim 6, wherein said fluid ejecting nozzle means is for ejecting a gas and a cleaning solution into said rotatable cup; and said apparatus includes a second nozzle means for dropping a coating solution on the workpiece, said second nozzle means being separate from and independent of said fluid ejecting nozzle means.

8. An apparatus according to claim 1, further comprising an arm, said cover being disposed below and supported on a distal end of said arm.

9. An apparatus according to claim 8, further comprising a shaft interconnecting said arm and said cover and mounted on said cover.

10. An apparatus according to claim 1, further comprising a flow-rectifying plate mounted on a lower surface of said cover and adapted to be disposed very closely above a surface of the workpiece when said cover covers the upper opening of said rotatable cup.

11. An apparatus according to claim 10, wherein said flow-rectifying plate is similar in shape to the plate-like workpiece and has dimensions slightly larger than the plate-like workpiece.

12. An apparatus according to claim 11, wherein said rotatable cup with the plate-like workpiece supported therein is rotatable with said flow-rectifying plate after the plate-like workpiece and said flow-rectifying plate have been positioned relatively to each other.

13. An apparatus according to claim 1, wherein the plate-like workpiece is rectangular in shape.

14. An apparatus for coating a plate-like workpiece with a solution, comprising:

a rotatable cup for supporting a plate-like workpiece therein, said rotatable cup having an upper opening for receiving the plate-like workpiece therethrough and a pedestal on a bottom thereof, said pedestal being substantially similar in shape to the plate-like workpiece, said pedestal having a ridge extending along an outer peripheral edge of an upper surface thereof, for engaging an outer peripheral edge of a lower surface of the plate-like workpiece;

a cover for covering said upper opening of said rotatable cup;

means for rotating said rotatable cup with the plate-like workpiece supported therein while said upper opening is covered by said cover, to spread a dropped solution uniformly over a surface of the plate-like workpiece under centrifugal forces;

an outer cup disposed around said rotatable cup with a radial clearance defined therebetween, said outer cup having an upper opening; and a second cover for covering said upper opening of said outer cup.

15. An apparatus for coating a plate-like workpiece with a solution comprising:

a rotatable cup for supporting a plate-like workpiece therein said rotatable cap having an upper opening for receiving the plate-like workpiece therethrough and a pedestal on a bottom thereof, said pedestal being fixed to said rotatable cup and substantially similar in shape m the plate-like workpiece, said pedestal having a ridge extending along an outer peripheral edge of an upper surface thereof, for engaging an outer peripheral edge of a lower surface of the plate-like workpiece:

a seal member mounted on an upper surface of said ridge:

a cover for covering said upper opening of said rotatable cup;

means for rotating said rotatable cup with the plate-like workpiece supported therein while said upper opening is covered by said cover, to spread a dropped solution uniformly over a surface of the plate-like workpiece under centrifugal forces:

said cover having a nozzle means for ejecting a fluid into said rotatable cup: and a flow-rectifying plate mounted on a lower surface of said cover, said flow-rectifying plate being disposed below said nozzle means such that the fluid ejected by the nozzle means flows over an upper surface of said flow-rectifying plate.

16. An apparatus for coating a plate-like workpiece with a solution, comprising:

a rotatable cup for supporting a plate-like workpiece therein, said rotatable cup having an upper opening for receiving the plate-like workpiece therethrough, a pedestal on a bottom thereof, and a wall joined to said bottom, said pedestal being substantially similar in shape to the plate-like workpiece, said wall being spaced a constant distance from an outer peripheral edge of the plate-like workpiece placed on said pedestal;

a cover for covering said upper opening of said rotatable cup;

means for rotating said rotatable cup with the plate-like workpiece supported therein while said upper opening is covered by said cover, to spread a dropped solution uniformly over a surface of the plate-like workpiece under centrifugal forces;

said pedestal having a central opening defined therethrough; and a vacuum chuck disposed in said central opening for attracting the plate-like workpiece to said pedestal under a vacuum, wherein the vacuum chuck is movable relative to the pedestal.

17. An apparatus according to claim 16, wherein the plate-like workpiece is rectangular in shape; and said apparatus further comprises a seal member mounted on an upper surface of said ridge for abutting against an outer peripheral edge of a lower surface of said plate-like workpiece.

18. Apparatus according to claim 16, wherein said rotatable cup further includes an annular peripheral wall extending upwardly from said bottom thereof, said annular peripheral wall being disposed radially outwardly of said wall spaced the constant distance from the outer peripheral edge of the workpiece, and an upper surface of said annular peripheral wall engages said cover; and an outer peripheral edge of said pedestal extends radially outwardly of said outer peripheral edge of said workpiece.

* * * * *

UNITED STATES PATENT AND TRADEMARK OFFICE
CERTIFICATE OF CORRECTION

PATENT NO. : 5,415,691
DATED : May 16, 1995
INVENTOR(S) : Shigemi Fujiyama, Kazunobu Yamaguchi, Hiroyoshi Sago It is certified that error appears in the above-indentified patent and that said Letters Patent is hereby corrected as shown below:

Column 2, line 18, change "Joined" to --joined--.

Column 3, line 49, change "annular wall 2" to --annular wall 22--;
line 67, change "Joined" to --joined--.

Column 7, line 5, change "anti" to --and--;
line 6, change "similar in shape m" to --similar in shape to--.

Column 8, line 41, change "similar in shape m"
to --similar in shape to--.

Signed and Sealed this

Seventh Day of November, 1995

Attest:

BRUCE LEHMAN

Attesting Officer       Commissioner of Patents and Trademarks